United States Patent [19]

Meakin

[11] Patent Number: 5,143,018
[45] Date of Patent: Sep. 1, 1992

[54] APPARATUS FOR DEPOSITING UNIFORM FILMS BY HOW-PRESSURE CHEMICAL VAPOR DEPOSITION

[75] Inventor: Douglas B. Meakin, Harrow-on-the-Hill, England

[73] Assignee: The General Electric Company, p.l.c., England

[21] Appl. No.: 690,041

[22] Filed: Apr. 23, 1991

Related U.S. Application Data

[63] Continuation of Ser. No. 399,469, Sep. 5, 1989.

[30] Foreign Application Priority Data

Dec. 18, 1987 [GB] United Kingdom ............... 8729547

[51] Int. Cl.⁵ .............................................. C23C 16/00
[52] U.S. Cl. ...................................... 118/715; 118/50; 118/728
[58] Field of Search ................. 118/50, 715, 725, 728; 156/345; 427/248.1

[56] References Cited

U.S. PATENT DOCUMENTS 4,926,793  5/1990  Arima et al. ....................... 118/715

FOREIGN PATENT DOCUMENTS

| | | |
|---|---|---|
| 0132408 | 1/1985 | European Pat. Off. . |
| 0178200 | 4/1986 | European Pat. Off. . |
| 0196170 | 10/1986 | European Pat. Off. . |
| 0208459 | 1/1987 | European Pat. Off. . |
| 0224360 | 6/1987 | European Pat. Off. . |
| 57-114659 | 7/1982 | Japan ................... 118/715 |
| 59-194424 | 11/1984 | Japan ................... 118/728 |
| 61-56729 | 7/1986 | Japan ................... 118/715 |
| 61-290713 | 12/1986 | Japan ................... 118/715 |
| 62-136813 | 6/1987 | Japan ................... 118/715 |
| 62-245624 | 10/1987 | Japan ................... 118/715 |
| 63-70514 | 3/1988 | Japan ................... 118/715 |
| 1587585 | 4/1981 | United Kingdom . |
| 2058731 | 4/1981 | United Kingdom . |
| 2111534 | 7/1983 | United Kingdom . |
| 2114160 | 8/1983 | United Kingdom . |
| 2165266 | 4/1986 | United Kingdom . |
| 2175016 | 11/1986 | United Kingdom . |

*Primary Examiner*—Shrive Beck
*Assistant Examiner*—Terry J. Owens
*Attorney, Agent, or Firm*—Kirschstein, Ottinger, Israel & Schiffmiller

[57] ABSTRACT

An apparatus for depositing a thin film of amorphous or polycrystalline silicon on substrates by a low-pressure chemical vapor deposition process includes a high-speed pump device connected to one end of a vapor deposition chamber and operative to maintain in the vapor deposition chamber a pressure at or below 20 milliTorr, an inlet adjacent the other end of the chamber for introducing gas into the chamber such that the gas flows from the gas inlet toward the pump device, and a substrate support within the vapor deposition chamber for orientating the major faces of the substrates substantially perpendicularly to the gas flow direction, wherein the combined conductance of the vapor deposition chamber, substrate support, and substrates is at least ten times the conductance of the pump device.

5 Claims, 1 Drawing Sheet

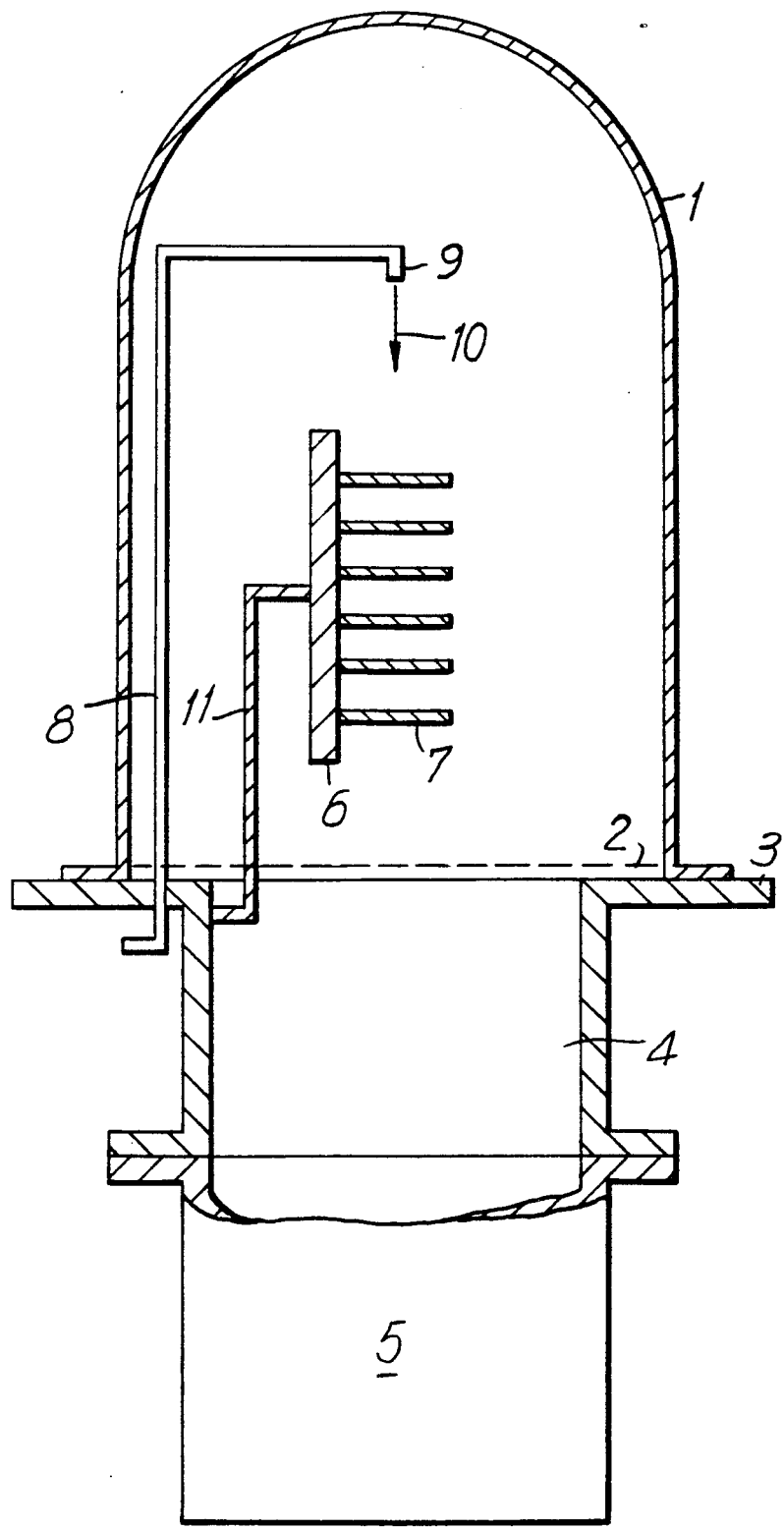

APPARATUS FOR DEPOSITING UNIFORM FILMS BY HOW-PRESSURE CHEMICAL VAPOR DEPOSITION

This is a continuation of application Ser. No. 07/399,469 filed Sep. 5, 1989.

BACKGROUND OF THE INVENTION

1. Field of the Invention

This invention related to deposition apparatus, and particularly to apparatus for the deposition of films by a low-pressure chemical vapour deposition (LPCVD) process.

2. Description of Related Arts

It is known, for example, to deposit polysilicon films on substrates by supporting the substrates within a deposition chamber, heating the chamber to a temperature of, say 630° C., and maintaining the pressure in the chamber at a very low level, say 10 to 30 Pascals, while passing silane gas through the chamber.

The need to achieve such a very low pressure level presents a problem. A high-capacity pump, such as a turbo-molecular pump, is required, but merely to substitute a high-speed pump in place of a normal pump connected to a LPCVD deposition chamber is found to produce poor uniformity of the films deposited on the substrate.

SUMMARY OF THE INVENTION

It is an object of the present invention to provide an LPCVD apparatus in which the quality of deposition at very low pressures is improved.

According to the invention there is provided apparatus for effecting deposition of a film on at least one substrate by a low pressure chemical vapour deposition process, comprising a deposition chamber; high-speed pump means connected to one end of the chamber; a gas inlet adjacent the opposite end of the chamber; and means to support the or each substrate within the chamber; wherein the dimensions of the chamber are selected such that the combined conductance of the chamber, the substrate support means and any substrate supported thereon is at least ten times the conductance of the pump means.

Apparatus according to the invention is found to give better deposition than conventional LPCVD apparatus for the following reasons.

In a typical conventional LPCVD apparatus, the conductance of the chamber is much larger than the combined conductance of the pump and the system for connecting the pump to the chamber. As a result, the pressure is substantially constant throughout the chamber, i.e. the chamber is isobaric.

Now, if a pump of much higher pumping speed is connected to the chamber in place of the normal pump, via a high conductance connecting system to maximise the available pumping speed, the conductance of the high-speed pump and connecting system and the conductance of the conventional chamber will be of comparable values. When gas is admitted at one end of the chamber and is pumped out at the other end, it is found that a pressure gradient is set up in the chamber due to a variation in the effective pumping speed along the length of the chamber, so that the growth rate on the wafers or substrates varies.

By ensuring that the conductance of the chamber and its contents is at least ten times the combined conductance of the pump and the connecting system, this pressure gradient is avoided, and uniform deposition can therefore be achieved.

BRIEF DESCRIPTION OF THE DRAWING

An embodiment of the invention will now be described, by way of example, with reference to the accompanying drawing which is a schematic cross-sectional view of a deposition apparatus.

DETAILED DESCRIPTION OF THE PREFERRED EMBODIMENT

Referring to the drawing, a deposition apparatus comprises a chamber 1 having an open base 2 which fits over and seals to an inlet flange 3 of a large-bore inlet duct 4 leading to a very high speed pump 5. The chamber may comprise a bell-jar, such as is commonly used for evaporation and deposition processes. A skeletal jig 6 located within the chamber is provided to hold a number of substrates 7 on which films are to be deposited. A gas injector pipe 8 passes into the chamber 1 through the flange 3 and terminates at an outlet 9 above the substrate mounting position. The jig 6 holds the substrates in such a manner that their major surfaces lie substantially perpendicular to the direction of flow of gas from the outlet 9 to the duct 4, as indicated by an arrow 10. The jig 6 is so constructed as to present minimum resistance to the gas flow, while still adequately supporting the substrates. The jig is mounted on at least one support 11.

In order to achieve a substantially constant pressure throughout the chamber 1, the dimensions of the chamber are selected such that the combined conductance of the chamber 1, the jig 6 and the substrates 7, from the gas outlet 9 to the flange 3, is at least ten times the combined conductance of the pump 5 and the duct 4.

Any suitable means (not shown) may be provided for heating the substrates. Such means may heat the substrates 7 directly, or may heat the chamber 1 and/or the incoming gas.

In use of the apparatus, substrates 7 are mounted in the jig 6, the bell-jar 1 is placed in position, and the pump 5 is operated to reduce the pressure in the bell-jar to a level in the range $10^{-6}$Torr to 0.55Torr, but preferably in the range $0.5-50 \times 10^{-3}$Torr, while the required gas or gases for film deposition are fed into the bell-jar. Such gas may be silane if polysilicon films are to be deposited on the substrates. In that case, the substrates are heated to 560–630° C.

It will be apparent that whereas a bell-jar is a convenient and readily-available device for use as the chamber 1, any other suitable enclosure may be used, provided that its conductance conforms with the above-mentioned criterion. The gas injector pipe 8 may then enter the chamber at the opposite end to the pump.

Although a single pump 5 is mentioned above, pump means comprising more than one pump may be provided.

I claim:

1. Apparatus for effecting deposition of a thin film of amorphous or polycrystalline silicon on a major surface of each of a plurality of substrates by a low-pressure chemical vapour deposition process, comprising:
   (a) a deposition chamber having chamber dimensions and opposite ends;
   (b) high-speed pump means connected to one of the ends of the chamber and operative to maintain the deposition pressure in the chamber at or below 20 milliTorr, the pump means having a conductance;

(c) a gas inlet adjacent the other of the ends of the chamber for introducing gas into the chamber so that the gas flows generally in a direction from the gas inlet to the pump means;

(d) substrate support means for supporting the substrates within the chamber oriented so that the major surfaces of the substrates are substantially perpendicular to the general gas flow direction;

(e) said chamber, said substrate support means and said substrates together having a combined conductance; and (f) said chamber dimensions being so selected such that said combined conductance is at least ten times said conductance of the pump means.

2. Apparatus as claimed in claim 1, wherein the gas inlet includes a conduit which extends into the chamber through said one end of the chamber and terminates adjacent said other end of the chamber.

3. Apparatus as claimed in claim 1, wherein the chamber comprises a bell-jar.

4. Apparatus as claimed in claim 1, wherein the pump means includes a duct having a flange against which said one end of the chamber seals.

5. Apparatus as claimed in claim 1, and further comprising means for feeding silane gas into the chamber through the gas inlet.

* * * * *

UNITED STATES PATENT AND TRADEMARK OFFICE
CERTIFICATE OF CORRECTION

PATENT NO. : 5,143,018
DATED      : Sep. 1, 1992
INVENTOR(S): Douglas B. Meakin

It is certified that error appears in the above-identified patent and that said Letters Patent is hereby corrected as shown below:

On the title page, correct item [22] as follows and insert the following:

[22]    PCT Filed:    Dec. 16, 1988

[86]    PCT No.    PCT/GB88/01125
            371 Date: Apr. 23, 1991
        102(e)Date: Apr. 23, 1991

[87]    PCT Pub.No.:    WO89/05871
            PCT Pub.Date:    June 29, 1989

Signed and Sealed this

Twelfth Day of October, 1993

Attest:

BRUCE LEHMAN

Attesting Officer      Commissioner of Patents and Trademarks